United States Patent [19]
Heidt

[11] 4,331,928
[45] May 25, 1982

[54] REFERENCED PHASE RF FEEDBACK LINEAR AMPLIFIER

[75] Inventor: Marvin W. Heidt, Cedar Rapids, Iowa

[73] Assignee: Rockwell International Corporation, El Segundo, Calif.

[21] Appl. No.: 155,279

[22] Filed: Jun. 2, 1980

[51] Int. Cl.³ .............................................. H03F 1/32
[52] U.S. Cl. .................................... 330/149; 330/151
[58] Field of Search .......................... 330/10, 149, 151

[56] References Cited

U.S. PATENT DOCUMENTS 3,777,275  12/1973  Cox ........................................ 330/10
3,909,742  9/1975  Cox et al. .............................. 330/84

OTHER PUBLICATIONS

Pappenfus et al., *Signal Sideband Principles and Circuits*, McGraw-Hill, Chapters 13, 14.

Primary Examiner—James B. Mullins
Attorney, Agent, or Firm—Richard K. Robinson; Howard R. Greenberg; H. Fredrick Hamman

[57] ABSTRACT

A feedback network for a linear amplifier provides for sampling the input signal and removing the modulation from the input signal while maintaining a 180° phase relationship with the input which is essentially the process of converting it into a square wave. The output signal is also sampled and the envelope separated from the sampled output signal and used to drive a modulator which modulates the square wave. This modulated square wave is then mixed with the input signal prior to amplification. In addition, automatic gain control is provided by a level comparator that compares the output signal with the input signal and the results of the comparison is used to attenuate or to control the level of the modulated square wave.

6 Claims, 2 Drawing Figures

REFERENCED PHASE RF FEEDBACK LINEAR AMPLIFIER

BACKGROUND OF THE INVENTION

This invention relates to feedback networks for linear amplifiers. One of the major disadvantages of linear solid state amplifiers is that intermodulation distortion performance is poor in comparison to their vacuum tube counterparts. It is generally difficult to apply RF feedback around multiple stage of broadband solid state linear amplifiers. The phase shift associated with these amplifiers varies too widely to consider any type of phase compensation network in the feedback loop. Without feedback, of course, the amplifier performance is limited to the capabilities of the transistors or tubes in the amplifier gain chain. The performance of an amplifier, in the Radio Frequency (RF) range, is measured by the intermodulation distortion produced by the application of two equal amplitude signals or tones, generally separated in frequency by 1 KHz, to the amplifier. Acceptable performance of the amplifier is when the intermodulation distortion is greater than 25 to 35 db below either tone and gain variation on the order of 6 db. It is generally accepted that application of feedback will improve the performance and reduce gain variation depending upon the amount of feedback employed. Traditionally, 10 db of feedback should improve the intermodulation distortion level by 10 db.

The problem was addressed in U.S. Pat. No. 3,777,275 in which non linear amplifying devices were used to produce bandpass linear amplification of a signal having amplitude variation. The input signal was transformed into two constant amplitude phase modulation components which together contain in their phase fluxuation the total information content of the input signal. The components were amplified separately by devices which preserved phase, and the recombination of the amplified components reproduced a linear amplified replica of the original signal input. This technique was primarily useful at high frequency, but also could be modified to provide a frequency translation.

Similarly in U.S. Pat. No. 3,909,742, hybrid combiners, nonlinear amplifying devices, phase varying devices and an attenuator were used to produce a linear amplified replica of a bandpass analog signal having amplitude variations. The original analog input signal and a feedback signal are applied to a hybrid combiner which subtracts the feedback signal from the original input signal to produce one of two components of equal amplitude and adds a feedback signal to the original input signal to produce the other component. The components are amplified separately by nonlinear amplifying devices and the amplified components then are recombined by a second hybrid combiner which produces two outputs. One output, the difference between the two components is the linearly amplified replica of the original signal. The other output, the sum of the two components, is the feedback signal which is applied through a series combination of the phase varying devices and the attenuator to the first hybrid component.

The problem of distortion in the use of feedback circuits to reduce or eliminate distortion was discussed for tube type amplifiers in Chapters 13 and 14 of the book entitled, "Signal Sideband Principles And Circuits" by E. W. Pappenfus, W. B. Bruene and E. O. Schoenike, published by McGraw-Hill.

SUMMARY OF THE INVENTION

A feedback network for a linear amplifier provides for sampling the input signal and removing the modulation from the input signal while maintaining a 180 degree phase relationship with the input which is essentially the process of converting it into a square wave. The output signal is also sampled and the envelope separated from the sampled output signal and used to drive a modulator which modulates the square wave. This modulated square wave is then mixed with the input signal prior to amplification. In addition automatic gain control is provided by a level comparator that compares the output signal with the input signal and the results of the comparison is used to attenuate or to control the level of the modulated square wave.

The circuitry disclosed utilizes a hybrid component as well as semi-conductors and can be used on essentially any power amplifier. However, the preferred embodiment discloses the circuitry for utilizing Radio Frequency feedback (RF) for a linear radio frequency amplifier.

Many advantages of the present invention may be ascertained from a reading of the specification and claims in conjunction with the drawings.

DESCRIPTION OF THE PREFERRED EMBODIMENT

Figure 1:
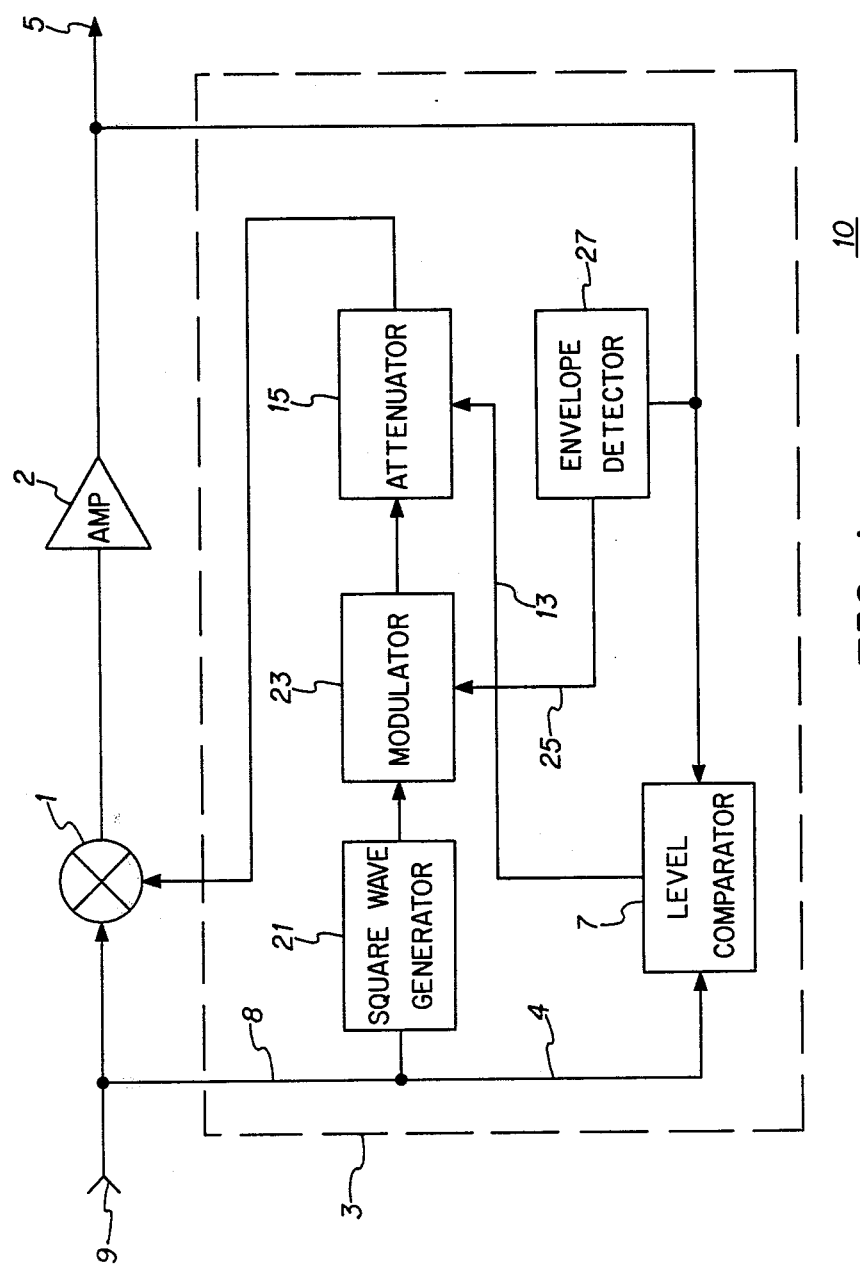
FIG. 1 is a simplified diagram of a radio frequency linear amplifier which has a reference phase RF feedback network.

Reference should now be made to FIG. 1 wherein the input signal is applied to the input terminal 9 of the linear amplifier 10 which includes a mixer stage 1, an amplifier stage 2 and a feedback loop 3 that includes a level comparator 7 for comparing the output of the amplifier 2 as it appears on terminal 5 with the input signal present on input terminal 9. Not only is the input signal, as mentioned earlier, applied to the level comparator 7, the mixer 1 but is also applied to the square wave generator 21. The output signal of the level comparator 7 results from the comparison of the input signal level present at terminal 9 and the output signal level present at terminal 5 and is utilized as an error signal which is applied to the attenuator 15 by conductor 13 to control the level of the mixing signal applied to the mixer 1. The mixing of the two signals distorts the input signal so as to compensate for the non linearities of the amplifier 2.

The mixing signal that is applied to mixer 1 is developed from the input signal at terminal 9 and the envelope of the output signal present at terminal 5. The input signal that is present on terminal 9 is converted to a square wave by the square wave generator 21 while maintaining a 180 degrees phase relationship between the input signal and the square wave. The square wave is then applied to the modulator 23 where it is modulated by the modulating signal on conductor 25. The modulation signal is essentially the envelope that is present on the output signal at terminal 5 that has been separated from the output signal by the envelope detector 27. The modulating signal modulates the square wave which is then applied to the attenuator 15. The attenuator adjusts the level of the mixing signal in relationship to the direct current level or error signal that is provided by the level comparator and applies the modulated square wave or mixing signal to the mixer 1 which mixes the mixing signal with the input signal. The resulting product is then amplified by amplifier 2. The mixing signal that is present on the output of the attenuator 15 has ideally a 180 degree phase relationship with the input signal that is present at terminal 9. It is important to note that although the amplifier 2 is shown as a single unit, it can represent a multi-state amplifier, which for optimum performance, the feedback loop should cover the whole amplifying chain. However, the mixing signal applied to the mixer 1 should have a 180 degree phase relationship with the input signal and the feedback network would thus reduce the intermodulation distortion that is usually present in solid state amplifier circuits, especially ganged amplifiers.

Figure 2:
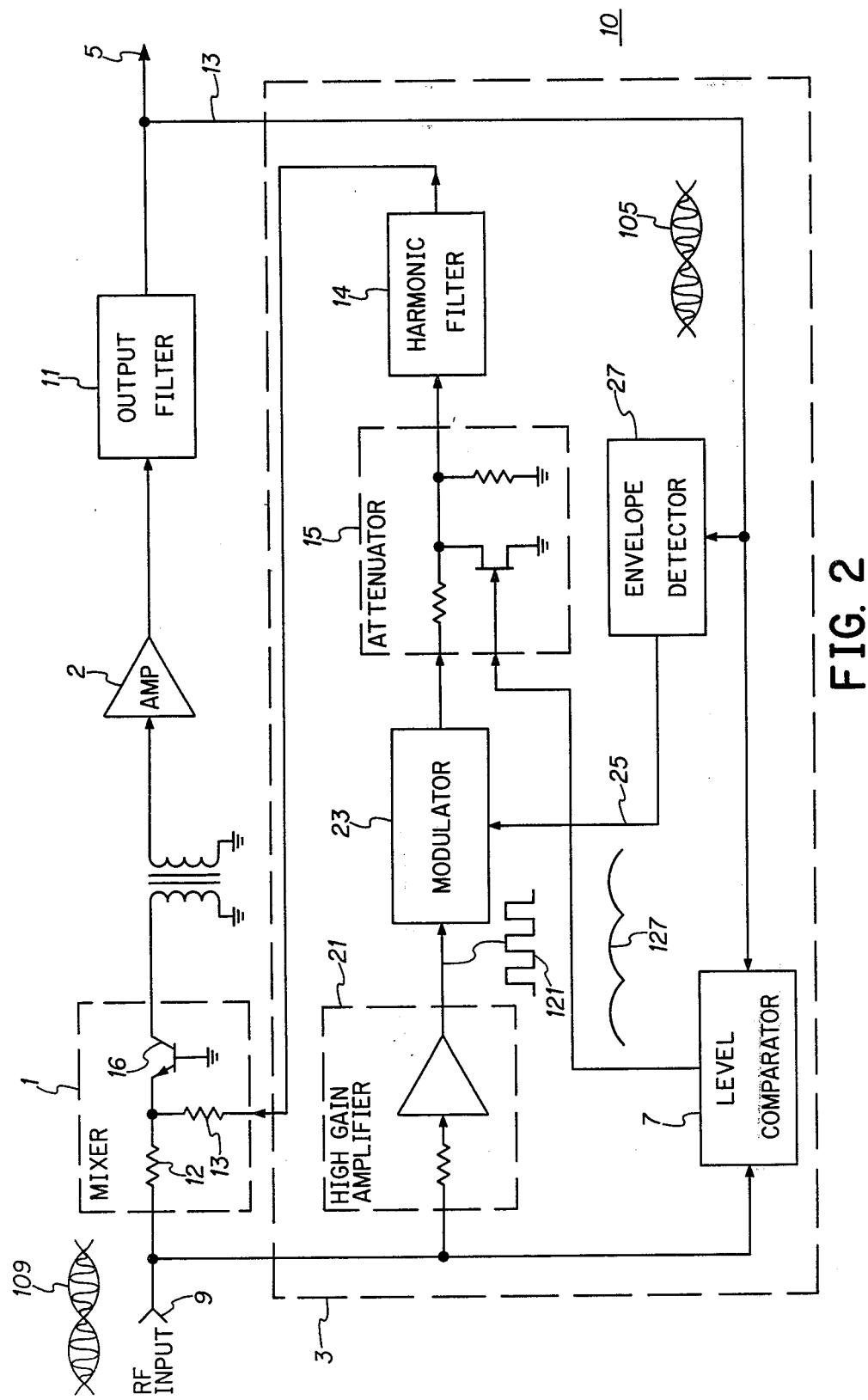
FIG. 2 is a schematic diagram of the radio frequency linear amplifier of FIG. 1.

In FIG. 2 there is provided a simplified schematic diagram of a linear amplifier 10 with a reference RF feedback network 3 that includes the amplifier 2 which can include a plurality of amplifier stages. An RF input signal is applied to the input terminal 9. The RF signal is a signal such as that represented by the waveform 109. The RF input signal is applied to the mixer 1 and also to a high gain amplifier 21. The high gain amplifier 21 is a limiter that converts the input signal into essentially a square wave such as that illustrated by waveform 121 which is applied to the modulator 23. The modulation signal that modulates the square wave is a feedback signal, represented by the waveform 105 and is picked off from the output terminal 5 by conductor 13.

The feedback signal is applied to the envelope detector 27 which separates the envelope from the signal and provides the envelope for modulation purpose to the modulator 23. The envelope signal is illustrated by waveform 127. The square wave is then modulated and applied to the attenuator 15. The attenuator is used to control the signal level of the mixing signal and is driven by the output of the level comparator 7.

The level comparator samples either the input power or voltage level that is applied to terminal 9 and compares it with the output power or voltage level that is present on terminal 5 and uses the results of the comparison to adjust the attenuator 15.

The output of the attenuator is filtered by the harmonic filter 14 to remove unwanted harmonics and spikes and applied to the feedback mixer 1 with a 180 degrees relationship with the input signal through resistor 12. Resistors 12 and 13 isolate the RF input signal source from the mixing signal through the low base impedance of transistor 16.

In summation, the above described invention obtains a sample of a radio frequency input signal to a broadband amplifier and feeds it to a high gain amplifier 21 the output of which is a square wave signal that is representative of the input signal. Because the square wave signal is limited, it contains no amplitude modulation component. The square wave output is connected to a modulator 23 which mixes the square wave input signal with the output of an envelope detector 27 which has separated the envelope from the output of the amplifier 2. The square wave is thus modulated with the envelope and fed into an attenuator 15 controlled by a level comparator 7. The level comparator 7 samples either the input power or voltage level and compares it with the output power or voltage levels and uses the results of the comparison to control an attenuator 15 which in turn controls the amount of feedback that is provided to the input of mixer 1. The function of the attenuator is to increase or decrease feedback in the mixer 1 in order to keep the gain of the overall amplifier constant. The output signal of the attenuator is filtered to remove harmonics and applied to the mixer 1, 180 degrees out of phase with the input signal.

In general, a sample of the signal that is applied to the linear amplifier is taken, modulation removed but the sample retains a phase relationship of 180 degrees with the input signal. The sample is modulated with the output signal's modulation envelope and level control with the controlled modulated sample signal being used as a feedback signal into the input.

Many changes and modifications in the above described embodiment of the invention can, of course be carried out without departing from the scope thereof. Accordingly, to promote the progress and science in useful arts, the invention is disclosed and is intended to be limited only by the scope of the appended claims.

I claim:

1. A feedback network for a linear amplifier comprising:
   mixer means for mixing an input signal to the linear amplifier with a feedback signal;
   circuit means for converting the input signal into a square wave;
   detector means for separating an envelope signal from the linear amplifier output signal; and
   modulator means for modulating the square wave with the envelope signal to obtain the feedback signal.

2. The feedback network for a linear amplifier according to claim 1 further comprising:
   comparator means for comparing the input signal with the output signal to obtain a control signal; and
   attenuator means to attenuate the feedback signal with the control signal.

3. The feedback network for a linear amplifier according to claim 2 further comprising a harmonic filter connected in series with the attenuator means and the mixer means.

4. The feedback network for a linear amplifier according to claims 1 or 2 wherein the means for converting the input signal into a square wave comprises a high gain amplifier connected in series with the input signal and the modulator means.

5. A method of phase compensating the feedback signal of a linear amplifier comprising:
   mixing an input signal to the linear amplifier with a feedback signal;
   converting the input signal into a square wave;
   separating an envelope signal from the linear amplifier's output signal; and
   modulating the square wave with the envelope signal to obtain the feedback signal.

6. The method of phase compensating the feedback signal of a linear amplifier according to claim 5 further comprising the steps of:
   comparing the input signal with the output signal to obtain a control signal; and
   attenuating the feedback signal with a control signal.

* * * * *